US009786468B2

(12) United States Patent
Yokosuka et al.

(10) Patent No.: US 9,786,468 B2
(45) Date of Patent: Oct. 10, 2017

(54) CHARGED PARTICLE BEAM DEVICE

(71) Applicant: Hitachi High-Technologies Corporation, Minato-ku, Tokyo (JP)

(72) Inventors: Toshiyuki Yokosuka, Tokyo (JP); Chahn Lee, Tokyo (JP); Hideyuki Kazumi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/762,621

(22) PCT Filed: Feb. 5, 2014

(86) PCT No.: PCT/JP2014/052609
§ 371 (c)(1),
(2) Date: Jul. 22, 2015

(87) PCT Pub. No.: WO2014/132757
PCT Pub. Date: Sep. 4, 2014

(65) Prior Publication Data
US 2015/0357154 A1    Dec. 10, 2015

(30) Foreign Application Priority Data

Feb. 26, 2013   (JP) ................................. 2013-035288

(51) Int. Cl.
*H01J 37/147*    (2006.01)
*H01J 37/22*    (2006.01)
(Continued)

(52) U.S. Cl.
CPC ........ *H01J 37/1474* (2013.01); *H01J 37/147* (2013.01); *H01J 37/22* (2013.01);
(Continued)

(58) Field of Classification Search
CPC ...... H01J 37/28; H01J 37/1474; H01J 37/147; H01J 37/244; H01J 2237/15; H01J 2237/2806
See application file for complete search history.

(56) References Cited

U.S. PATENT DOCUMENTS 5,493,116 A * 2/1996 Toro-Lira ................ H01J 37/28
                                                              250/310
7,449,690 B2 * 11/2008 Nishiyama ............ H01J 37/244
                                                              250/208.1
(Continued)

FOREIGN PATENT DOCUMENTS

JP        9-507331 A        7/1997
JP     2003-090719 A        3/2003
(Continued)

OTHER PUBLICATIONS

International Search Report dated Mar. 11, 2014, with English translation (Six (6) pages).

*Primary Examiner* — Wyatt Stoffa
(74) *Attorney, Agent, or Firm* — Crowell & Moring LLP

(57) ABSTRACT

An object of the invention is to provide a charged particle beam apparatus capable of performing high-precision measurement even on a pattern in which a width of edges is narrow and inherent peaks of the edges cannot be easily detected. In order to achieve the above object, there is proposed a charged particle beam apparatus including an opening portion forming member having a passage opening of a charged particle beam and a detector for detecting charged particles emitted from a sample or charged particles generated by causing the charged particles to collide with the opening portion forming member, the charged particle beam apparatus including: a deflector for deflecting the charged particles emitted from the sample; and a control device for controlling the deflector, the control device performing
(Continued)

pattern measurement with the use of a first detected signal in which a signal of one edge is emphasized relatively more than a signal of another edge among a plurality of edges on the sample and a second detected signal in which the signal of the another edge is emphasized relatively more than the signal of the one edge among the plurality of edges.

12 Claims, 13 Drawing Sheets

(51) Int. Cl.
  *H01J 37/244* (2006.01)
  *H01J 37/28* (2006.01)
(52) U.S. Cl.
  CPC ............ *H01J 37/244* (2013.01); *H01J 37/28* (2013.01); *H01J 2237/15* (2013.01); *H01J 2237/2806* (2013.01)

(56) References Cited

U.S. PATENT DOCUMENTS

| 7,462,828 | B2* | 12/2008 | Fukada | G01N 23/2251 |
| | | | | 250/306 |
| 7,875,849 | B2* | 1/2011 | Fukada | H01J 37/244 |
| | | | | 250/310 |
| 8,648,300 | B2* | 2/2014 | Isawa | G01N 23/2258 |
| | | | | 250/306 |
| 2006/0186351 | A1* | 8/2006 | Nishiyama | H01J 37/244 |
| | | | | 250/492.1 |
| 2006/0243906 | A1* | 11/2006 | Fukada | G01N 23/2251 |
| | | | | 250/307 |
| 2008/0099673 | A1* | 5/2008 | Fukuda | H01J 37/244 |
| | | | | 250/307 |
| 2012/0153145 | A1* | 6/2012 | Cheng | H01J 37/28 |
| | | | | 250/307 |
| 2013/0146766 | A1* | 6/2013 | Ohshima | H01J 37/265 |
| | | | | 250/310 |
| 2013/0254948 | A1* | 9/2013 | Hartong | H01J 37/28 |
| | | | | 850/1 |
| 2014/0284476 | A1* | 9/2014 | Ren | H01J 37/05 |
| | | | | 250/310 |
| 2015/0348748 | A1* | 12/2015 | Mizuhara | H01J 37/244 |
| | | | | 250/306 |

FOREIGN PATENT DOCUMENTS

| JP | 2006-172919 A | 6/2006 |
| JP | 2006-228999 A | 8/2006 |
| JP | 2006-332038 A | 12/2006 |
| JP | 2011-191296 A | 9/2011 |
| JP | 2012-023398 A | 2/2012 |
| JP | 2013-030277 A | 2/2013 |
| WO | WO 2010-061516 A1 | 6/2010 |

* cited by examiner

[FIG. 1]
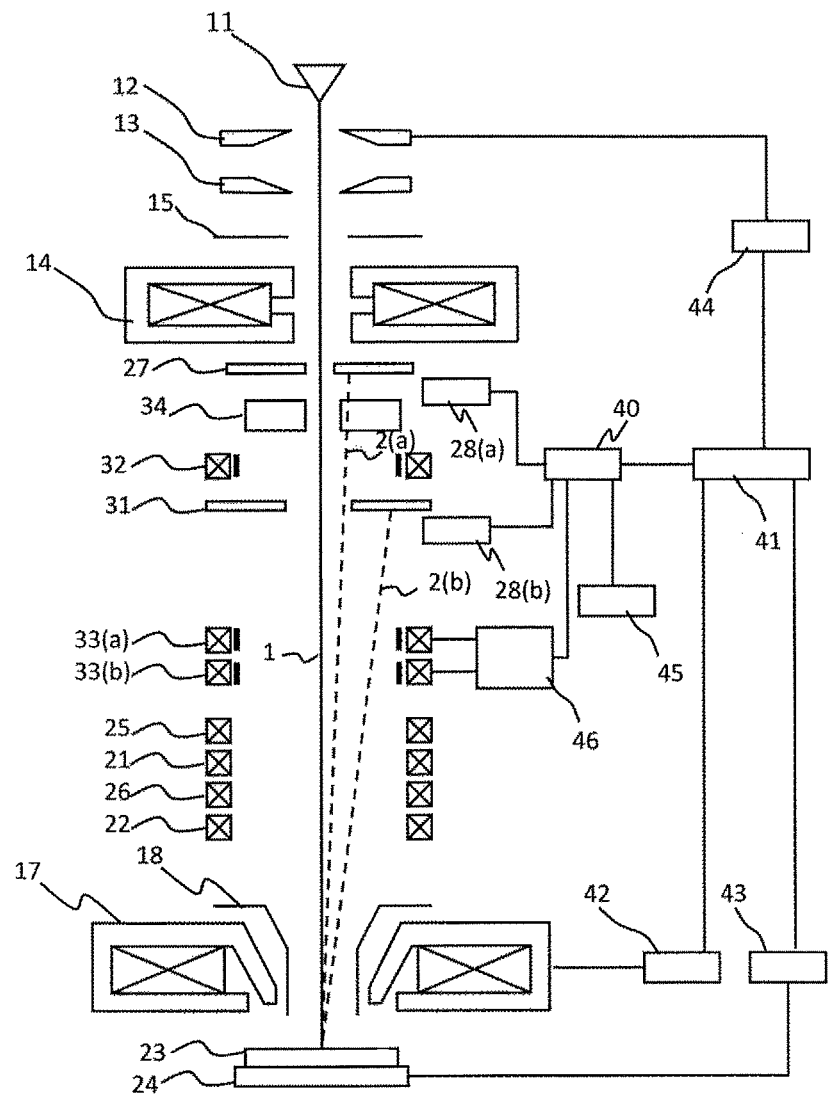

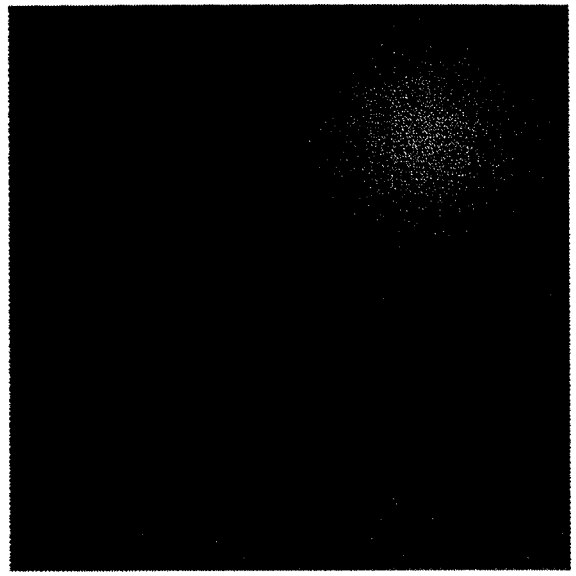
[Fig. 2A]
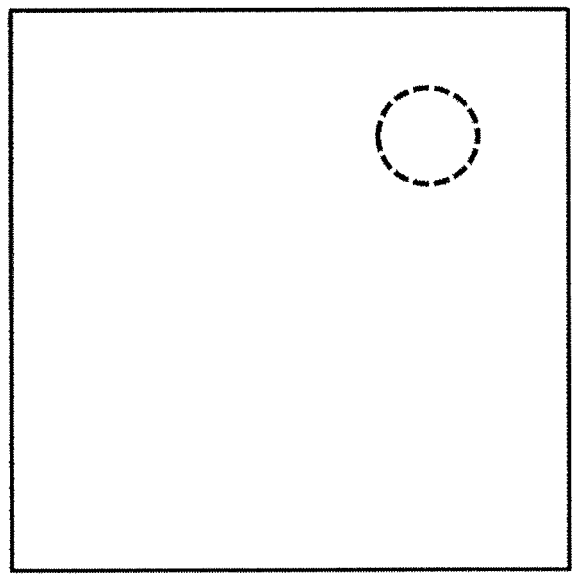
[Fig. 2B]

[FIG. 3]
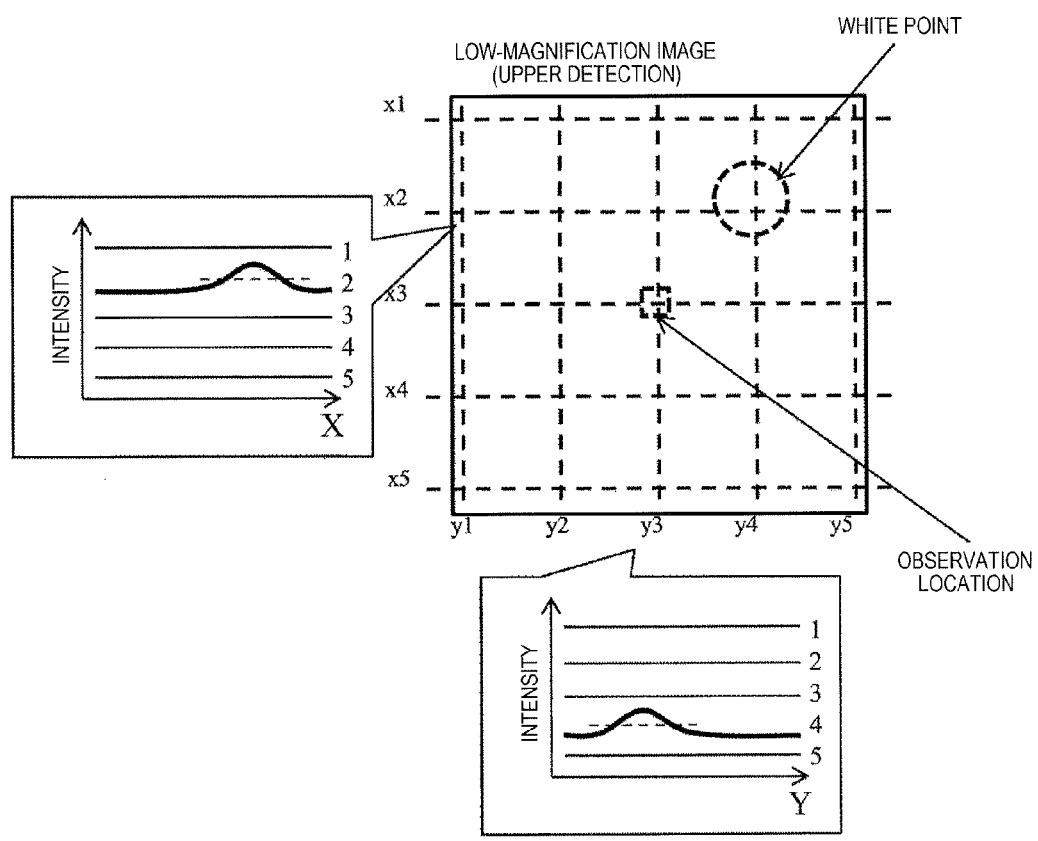

[FIG. 4]
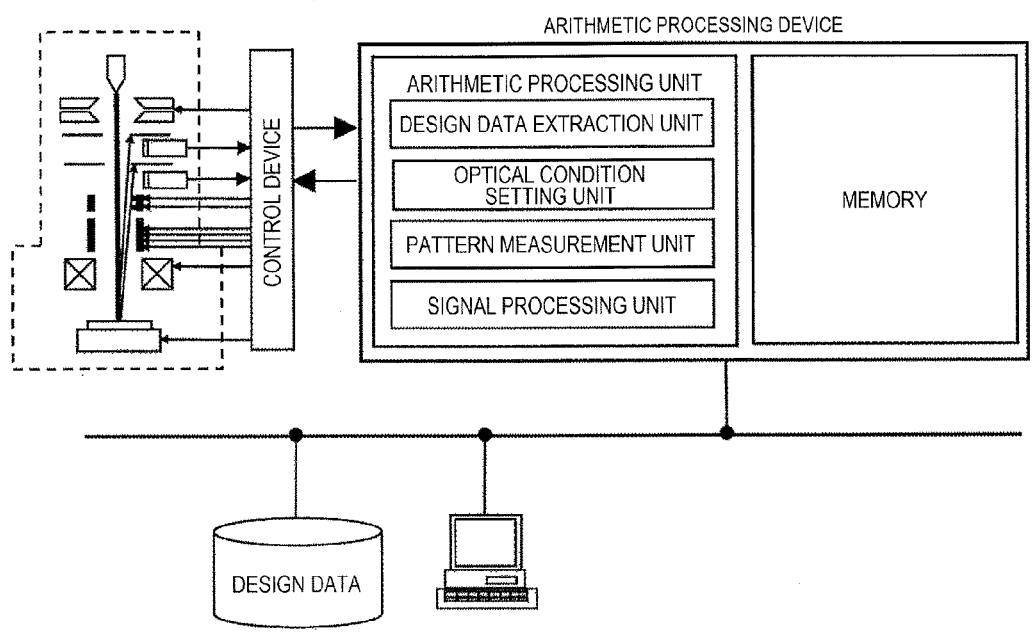

[FIG. 5]
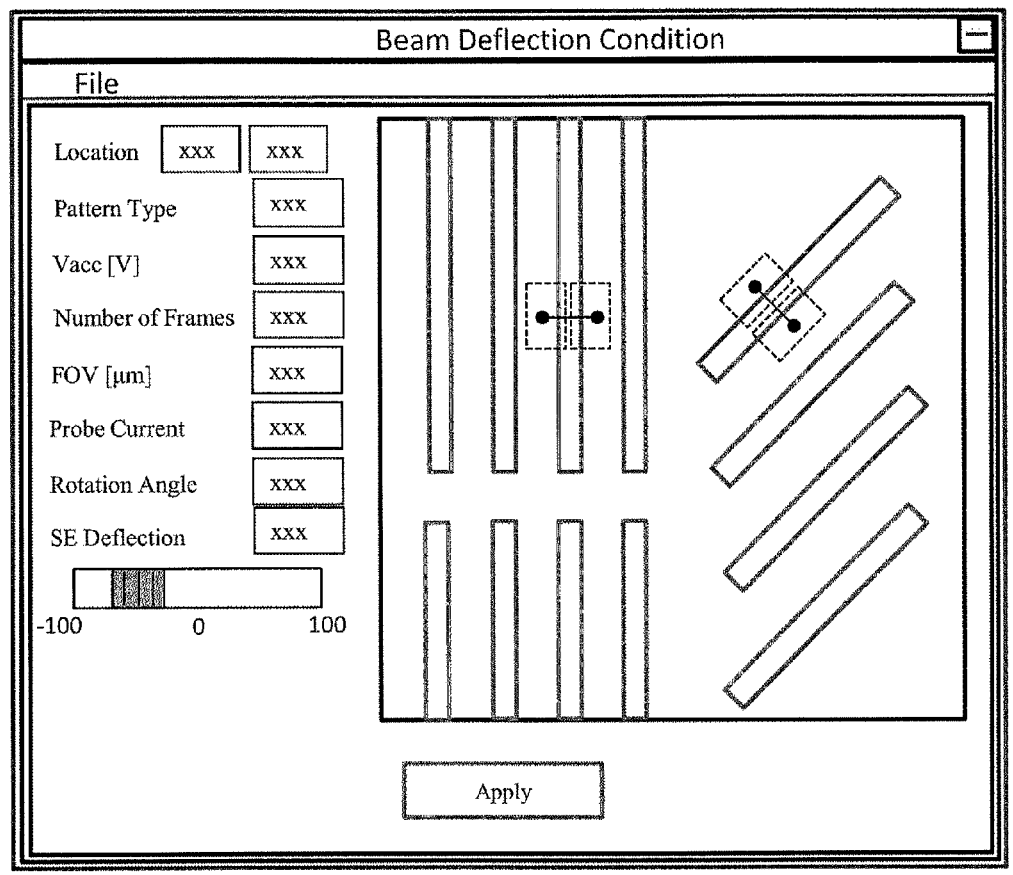
[FIG. 6]
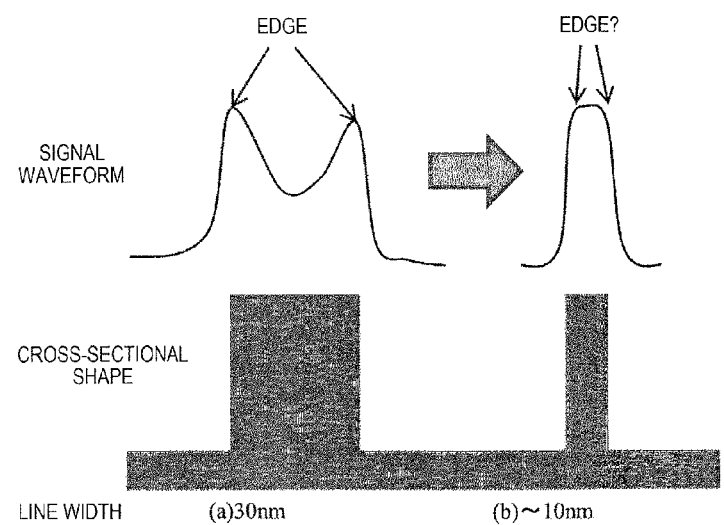

[FIG. 7]
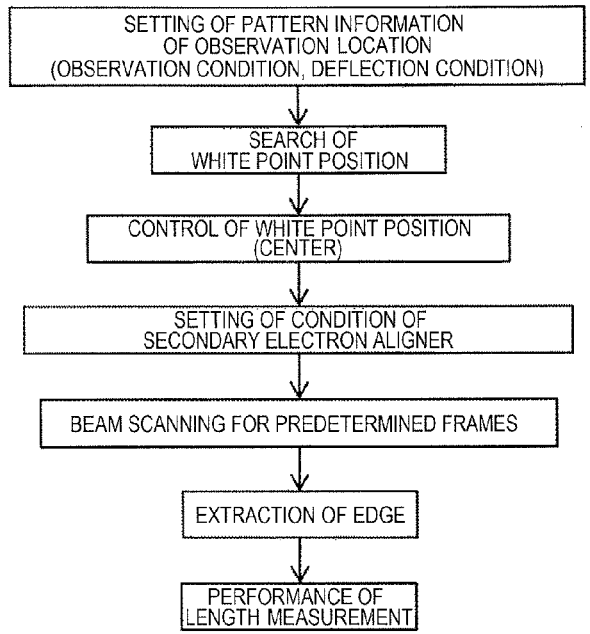
[FIG. 8]
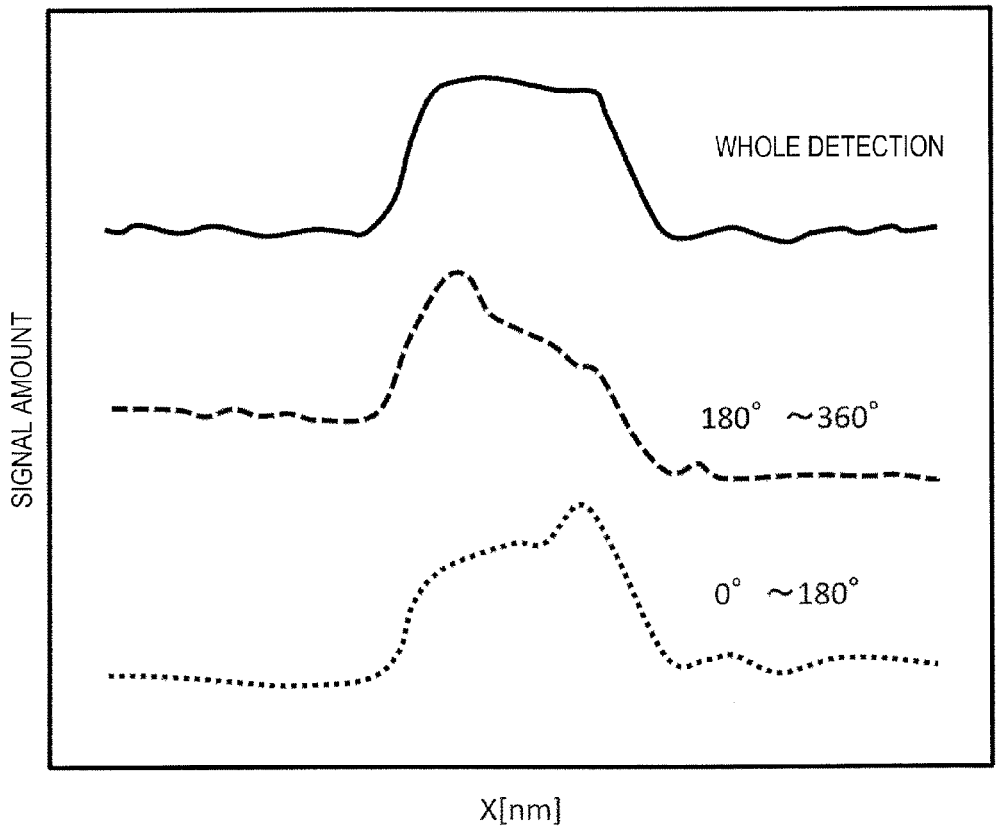

[FIG. 9]
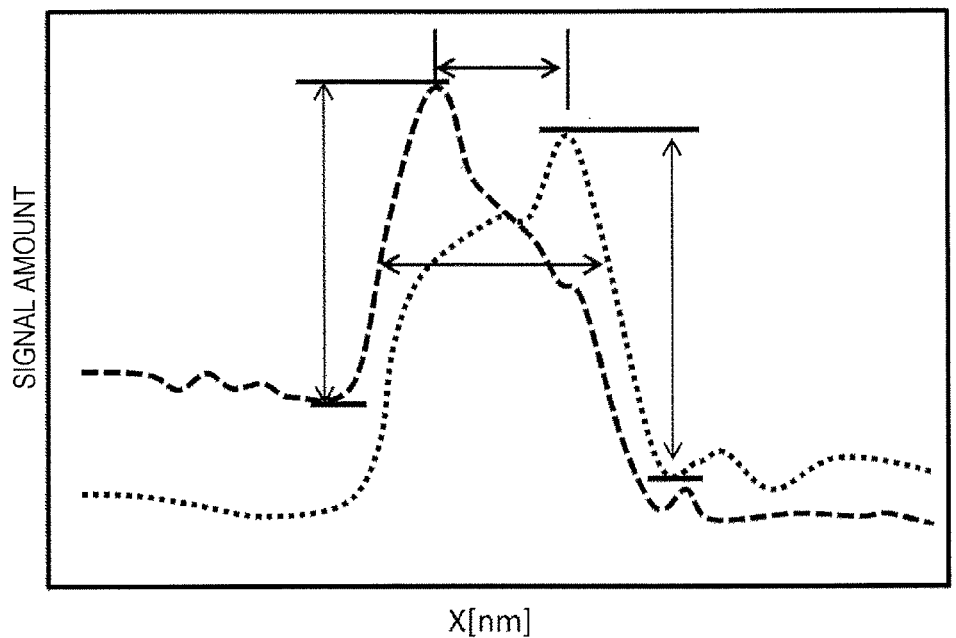
[FIG. 10]
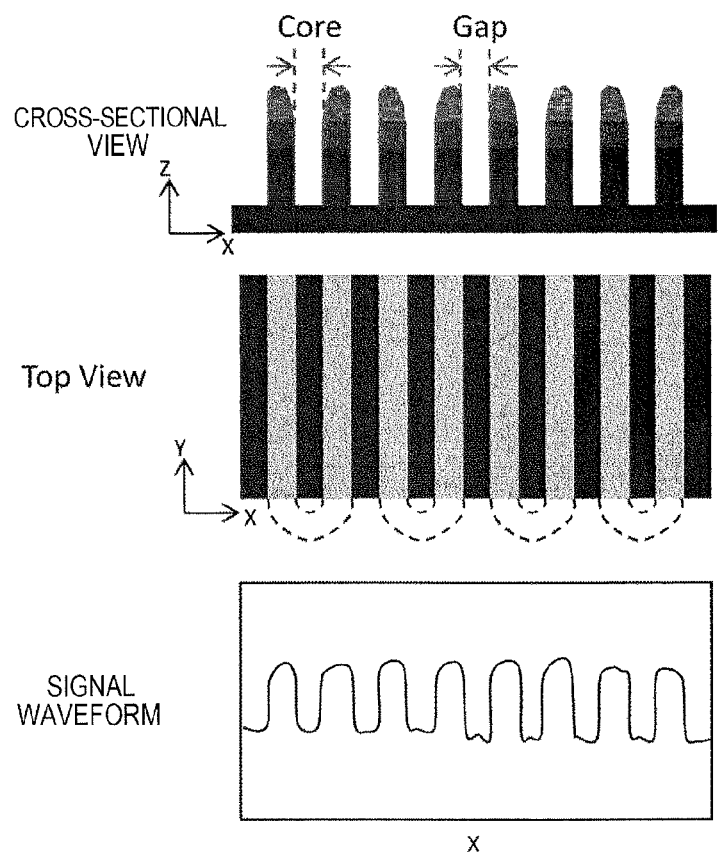

[Fig. 11A]
CROSS-SECTIONAL SHAPE
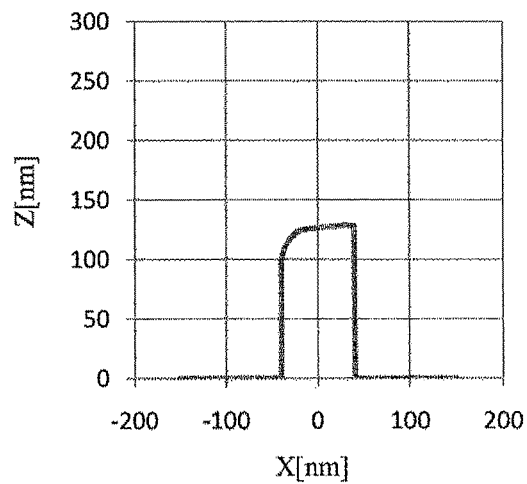
[Fig. 11B]
SIGNAL
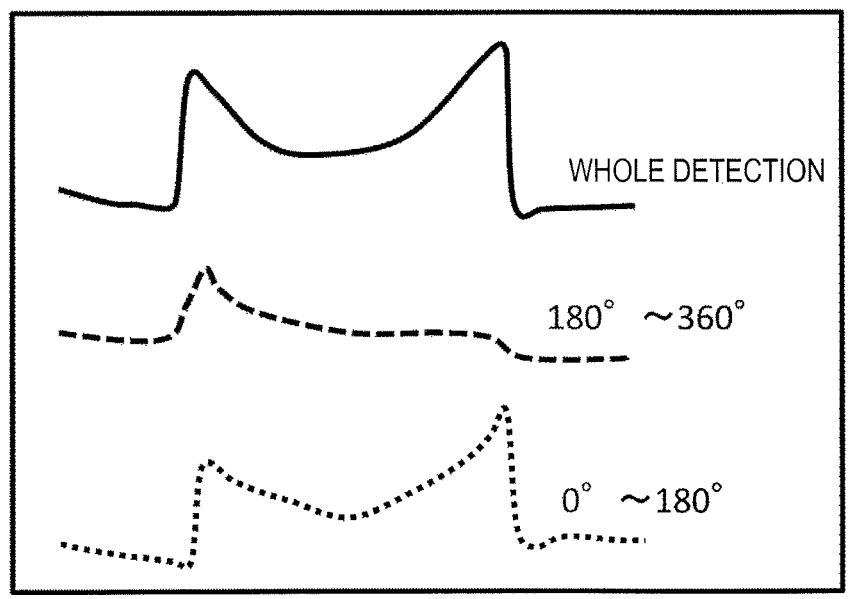

[FIG. 12]
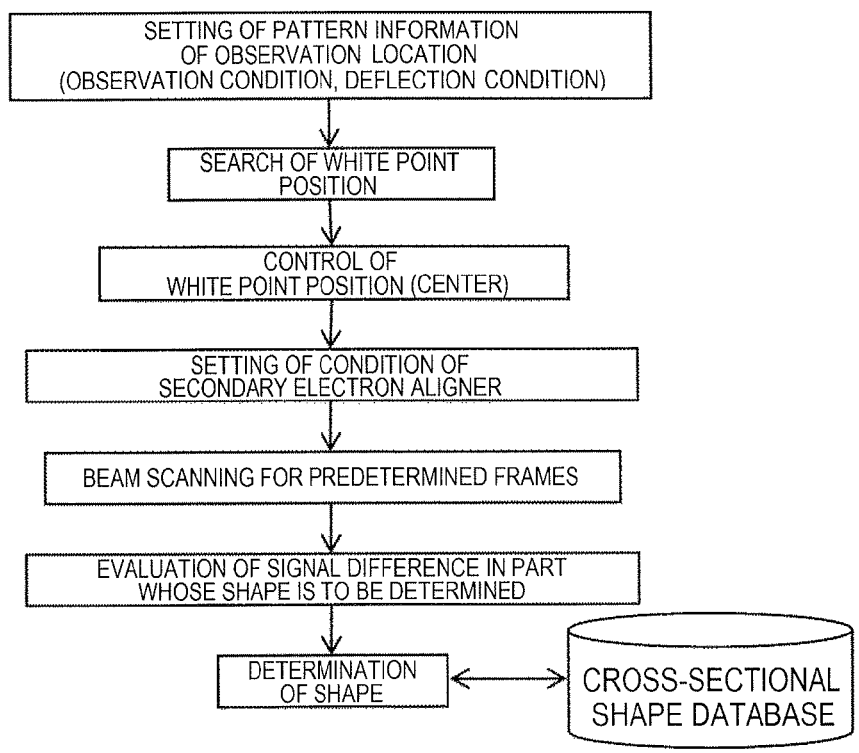

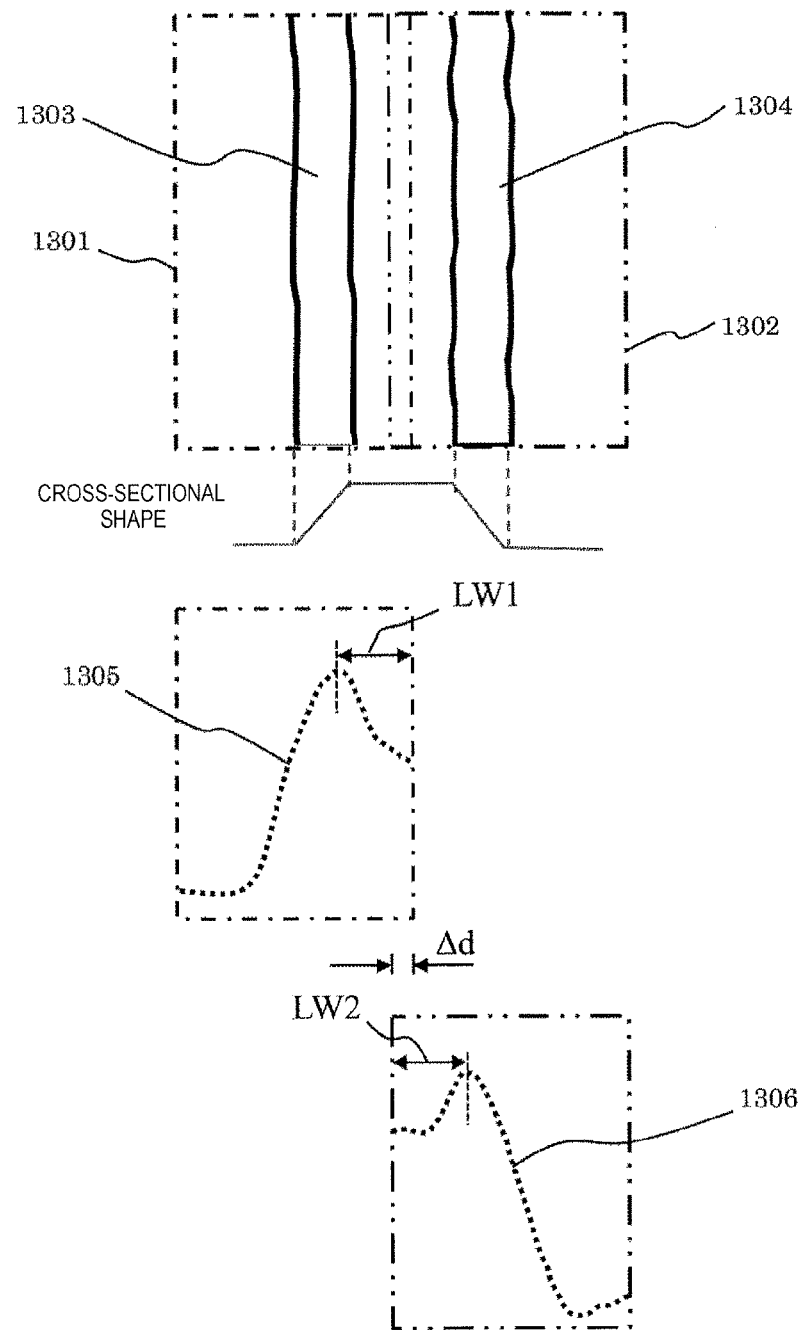
[FIG. 13]

[FIG. 14]
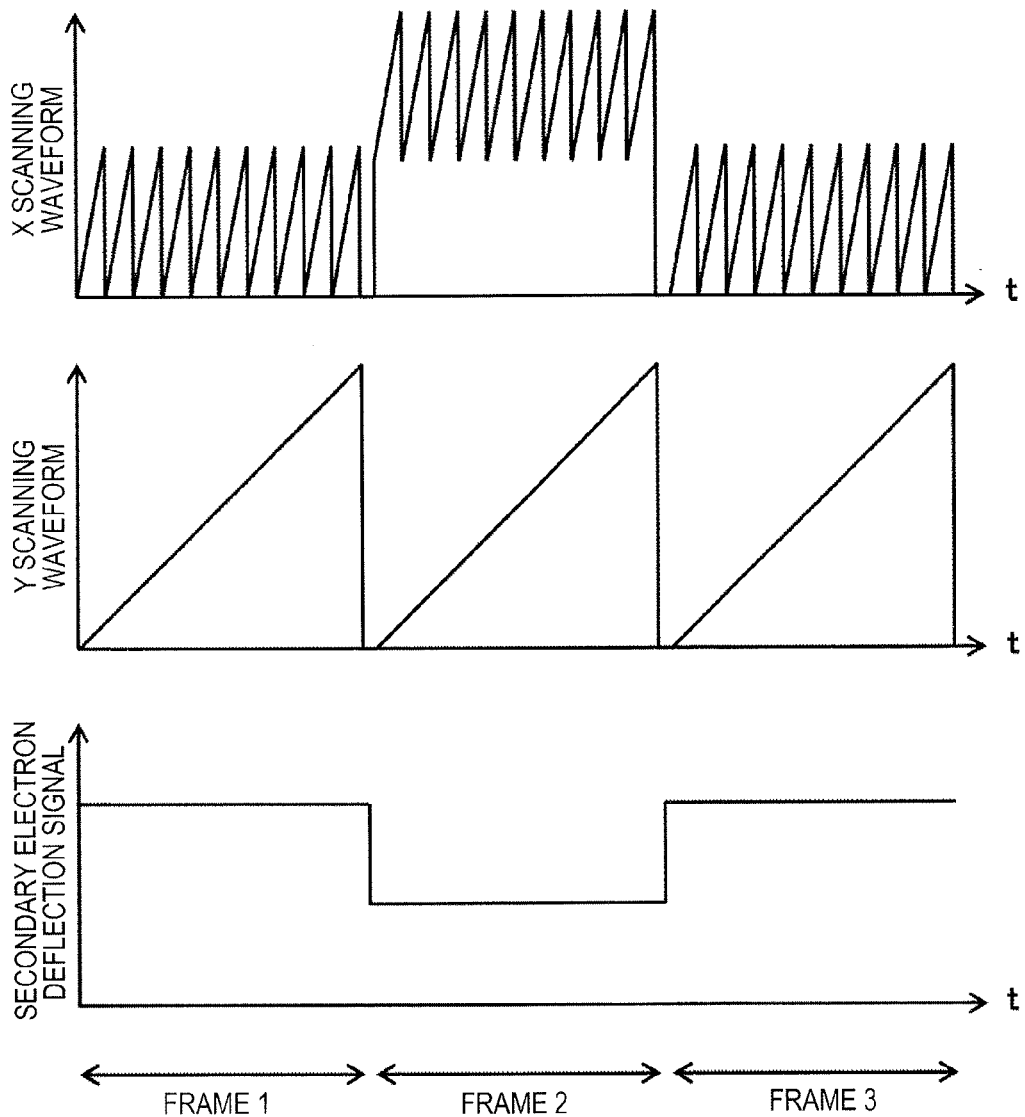

[FIG. 15]
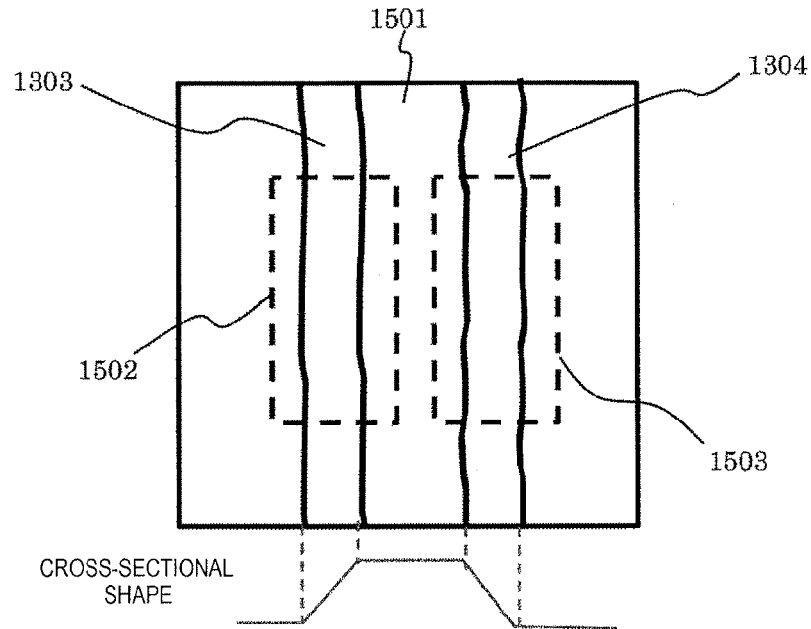
CROSS-SECTIONAL SHAPE
[FIG. 16]
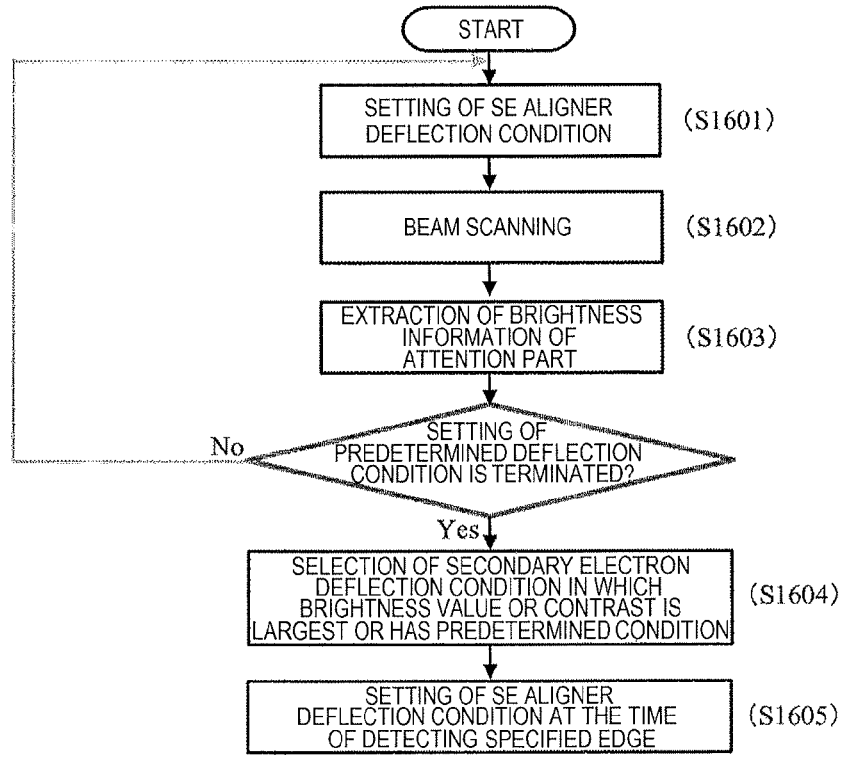

[FIG. 17]
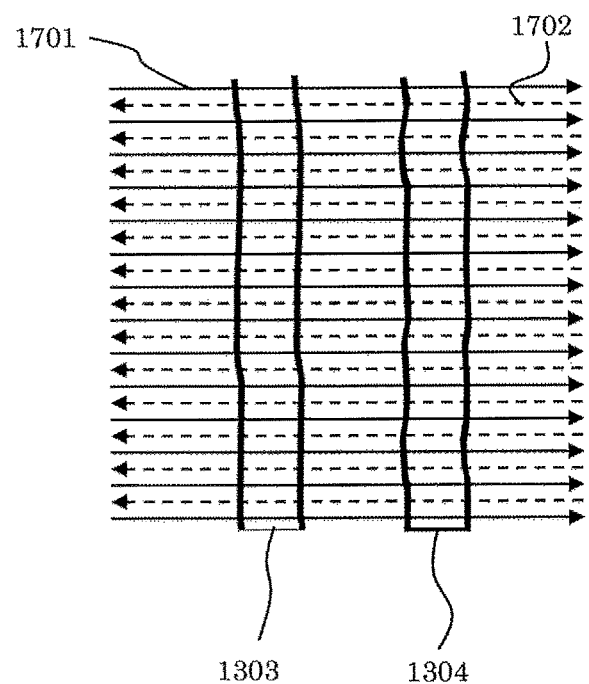

CHARGED PARTICLE BEAM DEVICE

TECHNICAL FIELD

The present invention relates to a charged particle beam apparatus and particularly relates to a charged particle beam apparatus which deflects a track of secondary electrons or the like emitted from a sample to form an image.

BACKGROUND ART

A slight shape difference influences an operating characteristic of a device in accordance with miniaturization of a semiconductor pattern, and therefore need for shape management is increased. Therefore, in a scanning electron microscope (SEM) for use in inspection and measurement of a semiconductor, high sensitivity and high precision are demanded more than before. Meanwhile, a form of a signal waveform has been changed in accordance with miniaturization of a pattern. In a case where a sample is irradiated with an electron beam, a greater amount of secondary electrons are emitted from a corner (edge) portion of a pattern in comparison with an amount of secondary electrons emitted from a flat portion. A shape is determined based on this difference between the emission amounts. In length measurement of a line, the length measurement is performed based on peaks of edges in both ends of the line. However, because a width of the line is decreased due to miniaturization, the peaks of the edges are overlapped and therefore cannot be separated. In view of this, characteristic signal detection using signal discrimination or the like is demanded.

In this case, emission distribution of secondary electrons obtained in a case where irradiation is performed with an electron beam is unchanged, and therefore it is important to separate detected secondary electrons. In order to separate detected signals, separation of secondary electrons based on an angle can be a solution. PTL 1 discloses a SEM including two detectors which discriminate and detect electrons (high angle electrons) passing through a track near an optical axis of an electron beam and electrons (low angle electrons) passing through a track relatively apart from the optical axis of the electron beam in order to form an image of a hole bottom with a high contrast on the basis of electrons emitted from a bottom of a deep hole such as a contact hole. PTLs 2 and 3 disclose a SEM including a secondary-electron deflector which controls a track of secondary electrons in order to make uniform detected signals in a plurality of detectors.

CITATION LIST

Patent Literatures

PTL 1: JP-T-09-507331 (the term "JP-T" as used herein means a published Japanese translation of a PCT patent application) (corresponding U.S. patent U.S. Pat. No. 5,493,116)
PTL 2: JP-A-2006-228999 (corresponding U.S. patent U.S. Pat. No. 7,449,690)
PTL 3: JP-A-2006-332038 (corresponding U.S. patent U.S. Pat. No. 7,462,828)

SUMMARY OF INVENTION

Technical Problems

As described in PTLs 1 to 3, a plurality of detectors are provided to perform angle discrimination, thereby selectively detecting electrons in a specified direction, and therefore it is possible to form an image which allows unevenness of a shape of a sample to be determined. In order to achieve this, there is described a method of arranging the detectors or secondary electron conversion electrodes at a specified angle of elevation or in an azimuth angle direction. However, in those cases, an angle and a direction at/in which signals can be discriminated are limited by arrangement of the detectors and the number of detectors. Further, it is difficult to perform discrimination at an arbitrary angle or in an arbitrary direction because an azimuth angle at which secondary electrons should be discriminated is changed depending on a pattern to be observed.

Therefore, hereinafter, a charged particle beam apparatus which is to deflect secondary electrons in an arbitrary direction in accordance with a shape of an observation pattern, discriminate the secondary electrons on the basis of an azimuth angle, and extract edge information of a fine pattern and a method of measuring a pattern will be described. Further, a charged particle beam apparatus which is to recognize a shape of a pattern which cannot be easily determined in a top-down image and a method of measuring a pattern will be described.

Solution to Problems

As an embodiment to achieve the above objects, there is proposed a charged particle beam apparatus including an opening portion forming member having a passage opening of a charged particle beam emitted from a charged particle source and a detector for detecting charged particles emitted from a sample or charged particles generated by causing the charged particles to collide with the opening portion forming member, the charged particle beam apparatus including: a deflector for deflecting the charged particles emitted from the sample; and a control device for controlling the deflector, the control device performing pattern measurement with the use of a first detected signal in which a signal of one edge is emphasized relatively more than a signal of another edge among a plurality of edges on the sample and a second detected signal in which the signal of the another edge is emphasized relatively more than the signal of the one edge among the plurality of edges.

Further, as another embodiment to achieve the above objects, there is proposed a charged particle beam apparatus including a control device which changes a deflection condition of a deflector which deflects charged particles emitted from the sample in accordance with a shape of a pattern.

Advantageous Effects of Invention

According to the above configurations, it is possible to cause edge information of a fine pattern whose edge peaks cannot be separated to become apparent and perform high-precision measurement based on the apparent peaks. Further, it is possible to recognize a pattern which cannot be easily determined in a top-down image.

BRIEF DESCRIPTION OF DRAWINGS

FIG. 1 schematically illustrates a scanning electron microscope.
FIGS. 2A and 2B illustrate a low-magnification image in an upper detector.
FIG. 3 illustrates X, Y one dimensional signal waveforms to determine a position of a white point.

FIG. 4 illustrates an example of a semiconductor measurement system including a scanning electron microscope.

FIG. 5 illustrates an example of a GUI (Graphical User Interface) for setting a measurement location and a secondary electron deflection amount.

FIG. 6 illustrates line patterns and signal waveforms.

FIG. 7 is a flowchart showing processes for extracting and measuring an edge position by azimuth angle discrimination.

FIG. 8 illustrates signal waveforms obtained by azimuth angle discrimination.

FIG. 9 illustrates length measurement positions to perform length measurement on the basis of signal waveforms obtained by azimuth angle discrimination.

FIG. 10 illustrates a cross-sectional shape and a Top View of a pattern formed by Self-Aligned Double Patterning and a signal waveform.

FIGS. 11A and 11B illustrate a cross-sectional shape of a line and signal waveforms obtained at the time of azimuth angle discrimination.

FIG. 12 is a flowchart showing processes performed when a shape difference is determined based on azimuth angle discrimination.

FIG. 13 illustrates a positional relationship between a beam scanning range for emphasizing a signal of one edge and a beam scanning range for emphasizing the other edge.

FIG. 14 illustrates a scanning signal example at the time of setting scanning regions for one edge and the other edge, respectively.

FIG. 15 illustrates an example where a region for extracting brightness information is set for each of two edges on a SEM image.

FIG. 16 is a flowchart showing processes for obtaining an appropriate secondary electron deflection condition.

FIG. 17 illustrates an example where bidirectional scanning and deflection of a secondary electron deflector are synchronized.

DESCRIPTION OF EMBODIMENTS

Hereinafter, there will be mainly described a charged particle beam apparatus including an opening portion forming member having a passage opening of a charged particle beam emitted from a charged particle source and a detector for detecting charged particles that have been emitted from a sample and have passed through the passage opening or a detector for detecting charged particles generated by collision of the charged particles that have passed through the passage opening with another member, the charged particle beam apparatus including: a deflector for deflecting the charged particles that have been emitted from the sample; and a control device for controlling the deflector, the control device controlling the deflector so that a track of the charged particles that have been emitted from the sample moves in an arbitrary direction in accordance with a shape of a pattern to be observed and performing length measurement on the basis of detected signals before and after deflection by the deflector.

Further, there will be described another charged particle beam apparatus including an opening portion forming member having a passage opening of a charged particle beam emitted from a charged particle source and a detector for detecting charged particles that have been emitted from a sample and have passed through the passage opening or a detector for detecting charged particles generated by collision of the charged particles that have passed through the passage opening with another member, the another charged particle beam apparatus including: a deflector for deflecting the charged particles that have been emitted from the sample; and a control device for controlling the deflector in accordance with a shape of a pattern to be observed, in which a signal waveform is formed based on output of the detector and length measurement of a size of the pattern on the sample is performed.

According to the above configurations, it is possible to cause edge information of a fine pattern whose edge peaks cannot be separated to become apparent. Further, it is possible to recognize a pattern which cannot be easily determined in a top-down image.

In order to selectively detect charged particles emitted in a specified direction, it is considered that a detector or a secondary electron conversion electrode is arranged at a specified angle of elevation or in an azimuth angle direction. As a main method for discrimination of an angle of elevation or an azimuth angle, a method using a plurality of detectors is employed. However, an angle and a direction at/in which signals can be discriminated are limited by arrangement of the detectors and the number of detectors, and therefore it is difficult to discriminate signals at an arbitrary angle or in an arbitrary direction.

In order to improve this point, it is considered that an annular detector including a plurality of detection elements is provided. However, in the annular detector, in a case where the division number of the element is increased to cause a discrimination property to have flexibility, detected signals for each element are reduced. Further, there is a possibility that accuracy of discrimination is deteriorated by an error in a production process of the apparatus. The deterioration of the accuracy caused by such production error can be suppressed to some extent by using a secondary electron aligner. However, a satisfactory signal amount cannot be obtained in some cases.

Hereinafter, a charged particle beam apparatus which can satisfactorily obtain signals based on charged particles emitted in a specified direction and can remove signals in other directions and a method of measuring a size of a pattern will be described with reference to drawings. In particular, in this example, a charged particle beam apparatus which can efficiently perform angle discrimination while preventing reduction of a signal amount for each detector or detection element, a detection efficiency error caused by variation in properties, field-of-view shift, and the like caused by using a plurality of detectors or detection elements in a case where secondary electrons are discriminated based on an angle of elevation/azimuth angle and a method of measuring a size of a pattern will be described.

In order to extract a shape of a target to be observed more clearly by, among signals from a sample, selectively detecting only necessary information and removing an unnecessary signal as a noise, charged particles emitted from the sample are deflected in an arbitrary direction by a deflector, and therefore charged particles which reach a detector are selectively detected in accordance with an emission angle. In an uneven pattern, by suppressing unnecessary information, it is possible to emphasize useful information and perform shape inspection and the like. More specifically, a limit member for causing a part of the charged particles emitted from the sample to selectively pass therethrough is provided, and the deflector is controlled so that the following two states are switched: a first deflection state in which charged particles in a first emission direction are caused to pass therethrough; and a second deflection state in which charged particles in a second emission direction different from the first emission direction are caused to pass therethrough. By such control, in a certain deflection state, information in a certain specified direction is emphasized and information in a direction other than the other specified directions is limited. That is, by changing the deflection state and detecting signals before and after the change, it is possible to improve S/N of signals in each of a plurality of directions. In particular, in a CD-SEM for measuring a size between a plurality of edges in different positions, it is possible to improve measurement accuracy thereof.

According to this example, it is possible to detect an edge position even in a fine pattern whose edge cannot be easily extracted, and it is possible to perform more precise and effective process management, in, for example, a production process of a semiconductor.

FIG. 1 schematically illustrates a scanning electron microscope which is a kind of charged particle beam apparatus. By applying an extraction voltage between a field emission cathode 11 and an extraction electrode 13, a primary electron beam 1 is extracted. The primary electron beam 1 is subjected to a convergence action in a condenser lens 14 and is subjected to scanning deflection in an upper scanning deflector 21 and a lower scanning deflector 22. Deflection intensities of the upper scanning deflector 21 and the lower scanning deflector 22 are adjusted so that two-dimensional scanning is performed on a sample 23 by using a lens center of an objective lens 17 as a fulcrum. Similarly, the primary electron beam 1 is subjected to a deflection action caused by an upper image shift deflector 25 and a lower image shift deflector 26 for changing a scanning position. The deflected primary electron beam 1 is further accelerated in an acceleration tube 18 provided in a passage of the objective lens 17. The primary electron beam 1 accelerated at a latter stage is stopped by a lens action of the objective lens 17 and reaches the sample 23 held by a holder 24.

By irradiation with primary electrons, secondary electrons are emitted from a surface of the sample 23. The secondary electrons can be classified as high-angle secondary electrons 2(a) in a direction parallel with an optical axis or secondary electrons 2(b) having a low-angle component in a direction parallel with the surface of the sample. The secondary electrons move through the optical axis in a direction opposite to a direction of the primary electrons and reach a secondary electron limit plate 31 (opening portion forming member). The high-angle secondary electrons 2(a) pass through a hole of the secondary electron limit plate 31, collide with a reflection plate 27 (conversion electrode) which is another member different from a detector to be converted into tertiary electrons, and are detected in an upper detector 28 (a). A secondary electron aligner 132 (secondary electron deflector) selectively changes the secondary electrons 2(a) toward the reflection plate 27, without deflecting the electron beam, so as to prevent the secondary electrons 2(a) from passing through an electron beam passage hole of the reflection plate 27 to move toward the field emission cathode 11.

The secondary electrons 2(b) on a low-angle side collide with the secondary electron limit plate 31 to be converted into tertiary electrons and are detected in a lower detector 28 (b). Detected signals are processed with the use of a computer 40, and signals detected by each of the detectors are subjected to digital imaging. In order to improve image S/N, the obtained signals may be added and imaged. A control device 41 is connected to the computer 40, an objective lens control power supply 42, a retarding voltage power supply 43, an acceleration voltage power supply 44, a storage device 45, a secondary electron aligner control power supply 46, and the like and controls operation of those devices.

In order to perform angle discrimination, it is necessary to cause the high-angle secondary electrons 2(a) to pass through the hole of the secondary electron limit plate 31. However, in some cases, a track of the secondary electrons is apart from the optical axis due to an influence of the use of an image shift or passing through the objective lens 17. On the contrary, as a result of assembly accuracy or an optical axis adjustment system or in order to select a hole diameter, the hole of the secondary electron limit plate 31 is intentionally provided in a position apart from the optical axis in some cases. Usually, a secondary electron aligner is used to cause the high-angle secondary electrons 2(a) to always pass through the hole of the secondary electron limit plate 31. Deflection of the track of the secondary electrons is controlled with the use of a secondary electron aligner II(L) 33(a) and a secondary electron aligner II(U) 33(b). The secondary electron aligners include a Wien filter including an electrode and a magnetic coil so as not to influence the track of the secondary electrons. Note that, in the following description, there will be described an example where secondary electrons and the like emitted from a sample are caused to collide with the opening portion forming member such as the secondary electron limit plate 31 and secondary electrons generated by the collision are detected by the detectors. However, the invention is not limited thereto, and, for example, it is also possible to employ a direct detection method in which a secondary electron limit plate serves as a detector. In this case, the detector is an opening portion forming member.

<White Point Control>

In a case where signals are separated by the upper and lower detectors, which detector secondary electrons enter is determined based on a reach position of secondary electrons toward the secondary electron limit plate which separates the secondary electrons. In order to deflect the secondary electrons in a direction orthogonal to an observation pattern, it is necessary that a reach position serving as reference when the secondary electrons are not deflected is the center of the limit plate, i.e., separation caused by an azimuth angle is not generated. By deflecting the secondary electrons in an arbitrary direction on the basis of this condition, it is possible to separate the secondary electrons at an arbitrary azimuth angle.

Therefore, a method of setting the reach position of the secondary electrons at the center of the secondary electron limit plate will be described below. In a case where a sample is scanned at a low magnification (e.g., 1000 times), in the upper detector, an image illustrated in FIG. 2(a) is obtained. FIG. 2(b) illustrates a region having high brightness with a dotted line. The region having the high brightness (hereinafter, referred to as a white point) is a region where a greater amount of secondary electrons have passed through the secondary electron limit plate, as compared with other regions therearound. Herein, in a case where an observation magnification is switched to a high magnification at the same location, the white point region is not included in an observation region, and therefore a detected signal amount is reduced and the S/N is decreased.

It is considered that a length measurement reproducibility is reduced because the detected signal amount is changed depending on a position of the white point and the S/N varies. Therefore, the reach position of the secondary electrons at the time of reaching the secondary electron limit plate is controlled with the use of an SE aligner so that the position of the white point is always included in the observation region at a high magnification. Specifically, the white point is moved to the center of a field of view (FOV), and azimuth angle discrimination is performed on the basis of this condition (condition without azimuth angle discrimination). In a case where an observation sample is a non-charged sample such as a metal, it is only necessary to deflect secondary electrons so that a position of a white point is the center of the FOV at a low magnification. Meanwhile, it is known that, in a case where a surface of a sample is a charged material, charges are accumulated on the surface, and a track of secondary electrons is changed by influence of charging, and therefore a position of a white point is changed. Therefore, even if the position of the white point is moved at a low magnification, the position of the white point is changed in a case where a state is changed due to, for example, relaxation of time of charging therearound until the sample is actually observed. Therefore, it is necessary to determine where the position of the white point exists in a case where the sample is observed at a high magnification without performing irradiation at a low magnification.

On the contrary to the above, in this example, one dimensional scanning is performed in an X direction and a Y direction, and a position of a white point is predicted based on signal waveforms. In this case, it is possible to suppress charge accumulation on the sample by providing scanning lines so that the scanning lines have a satisfactory distance. For example, in a case where the number of scanning lines is five and a magnification is 10,000 times (FOV=13.5 µm$^2$), a distance between the scanning lines is 1.35 µm, and therefore electrical charge accumulation caused by irradiation at a low magnification can be substantially ignored.

Steps for determining a position of a white point will be described with reference to FIG. 3. Herein, as an example, scanning is performed with the use of five scanning lines in each of the directions X and Y. Waveforms X2 and Y4 including a region having brightness of a threshold or more are extracted from obtained signal waveforms in the respective X and Y directions. A size of the white point is determined based on a retarding voltage, and therefore the region including the white point is predicted in each of the X and Y directions in accordance with an observation condition. Based on a result of the prediction, the white point is moved with the use of the SE aligner so that the position of the white point is the center. In this case, by obtaining a voltage per unit applied to an electrode and a magnetic coil of the SE aligner and a relational expression of a current change amount and a white point move amount and forming the voltage and the relational expression as database in advance, it is possible to adjust the position of the white point even in a case where the position of the white point is not checked on a screen.

<Association with Design Data>

The control device 40 not only controls each configuration of the scanning electron microscope but also has a function of forming an image on the basis of detected electrons and a function of measuring a pattern width of a pattern formed on a sample on the basis of intensity distribution of the detected electrons called line profile.

FIG. 4 illustrates an arithmetic processing unit of the apparatus. An arithmetic processing device includes an optical condition setting unit for setting an optical condition of a design data extraction unit and the SEM on the basis of a measurement condition and the like inputted with the use of an input device, a deflection condition setting unit for deflecting a track of secondary electrons, and a pattern measurement unit for measuring a pattern on the basis of obtained signals. The design data extraction unit reads design data from a design data storage medium on the basis of the condition inputted with the use of the input device and converts vector data into layout data as necessary. The deflection condition setting unit performs the white point control described above and the like. The pattern measurement unit for measuring a size of a pattern on the basis of an obtained signal waveform is included therein. The pattern measurement unit forms, for example, a line profile on the basis of detected signals and measures a size between peaks of the profile. In this case, it is also possible to extract left and right peaks with the use of line profiles obtained in the plurality of detectors and measure the size between the peaks on the basis of values thereof.

A direction in which secondary electrons are deflected with respect to the sample is automatically set when an operator arbitrarily specifies a location to be subjected to length measurement with the use of a cursor box. For example, in a case where a target to be observed is lines & spaces as illustrated in FIG. 5, when a part to be subjected to length measurement is specified with the use of the cursor box, a deflection direction of secondary electrons is determined to be a length measurement direction (in this case, X direction and 45° direction). A deflection amount of the secondary electrons can be set to −100% to 100%. 0% is set as no deflection, and 50% is a condition in which a half distance of a size of a white point is deflected. "±" denotes the deflection direction, and azimuth angles at which secondary electrons enter the upper and lower detectors are opposite between "+" and "−". For example, electrons having the same azimuth angle are detected in an upper detected image of +50% and a lower detected image of −50%. In a case of 100%, all secondary electrons are detected by the lower detector. In order to equalize azimuth angle components of upper and lower secondary electrons, ±50% is desirably set.

EXAMPLE 1

A specific method of extracting edges of a pattern to perform measurement by discriminating secondary electrons based on an azimuth angle will be described below. FIG. 6 illustrates two kinds of line patterns and signal waveforms obtained when lines thereof are scanned. In edges of each pattern, secondary electrons are also emitted from side walls of the line, and an emission area is increased, and therefore a signal amount is increased, as compared with a case where a flat surface is irradiated. Usually, length measurement is performed between edge peaks appearing in both ends of the line (FIG. 6(a)).

Meanwhile, in a case where a size of the pattern is small, peaks of edges are overlapped, and therefore it is difficult to individually extract the peaks in both ends (FIG. 6(b)). This is because a size of a scattering sphere is larger than a size of the line, and it is shown that, even in a case where one edge of the line is irradiated, secondary electrons and primary electrons are emitted from a side wall on an opposite side of the line and an edge effect exhibits in all locations of the line.

In this example, even in a case where a size of a line is small and edges in both ends are overlapped and therefore extraction thereof is difficult, secondary electrons are discriminated based on an azimuth angle in order to extract peaks of the edges. FIG. 7 illustrates a flow of measurement. An observation location is specified and a deflection condition is set as described above. A position of a white point in the observation location is searched, and the position of the white point is adjusted to be the center of the observation location. By using this deflection as a reference condition, secondary electrons are deflected. In this case, because the line extends in the Y direction, and therefore secondary electrons are deflected in the X direction orthogonal to the pattern, and scanning is performed with beams for the predetermined number of frames to thereby obtain an image. FIG. 8 illustrates signal waveforms detected by scanning the pattern of FIG. 6 (b). In whole detection, it is difficult to determine left and right edge positions. However, by separating the left and right edge positions on the basis of azimuth angles (0° to 180° and 180° to 360°), peaks are obtained in different positions in two signal waveforms. The obtained peaks are the edge positions of the pattern, and length measurement is performed based on the two signal waveforms. FIG. 9 illustrates an example of length measurement. The left and right edge positions are individually obtained from the respective signal waveforms, and length measurement is performed between the edges. The peak positions of the edges may be used or length measurement may be performed with a threshold method using a value between a peak and a bottom of each signal waveform. Two images are obtained by dividing and detecting secondary electrons emitted at the same timing, and therefore it is unnecessary to consider a positional displacement and the like between the images. In a case where the two edges in the both ends of the line are obtained in each image, image processing, such as addition of the images of the upper and lower detectors, may be performed to improve the S/N.

In this example, the deflection condition of the secondary electron deflector is adjusted so that electrons having a relatively greater amount of left edge information pass through a passage opening of the opening portion forming member. The electrons (first detected signals) which have passed through the passage opening are detected by the upper detector, and a first waveform signal in which the left edge information is emphasized (signal waveform in which the left edge information is emphasized relatively more than right edge information) is formed. Meanwhile, electrons detected by the lower detector are other electrons (second detected signals) other than the first electrons, and therefore it is possible to form a second signal waveform in which the right edge information is emphasized relatively more than the left edge.

As described above, by emphasizing signals at one edge more than those at the other edge (weakening the signals at the other edge more than those at one edge), it is possible to emphasize signals of two or more edges which are measurement reference, and, as a result, it is possible to perform high-precision measurement.

FIG. 15 illustrates an example of a line pattern 1501 having two edges 1303 and 1304. FIG. 16 shows a flowchart showing processes for obtaining a deflection condition of secondary electrons with the use of the line pattern 1501. First, the secondary electron aligner is set to have a predetermined condition, and brightness information of attention region (s) 1502 and/or 1503 is extracted by performing scanning with the primary electron beam 1 (Steps 1601 to 1603). Those steps are performed for each of a plurality of setting conditions set in the secondary electron aligner. Herein, in a case where a peak signal of the edge 1303 is detected with the use of the upper detector, an appropriate secondary electron aligner condition is a state in which a peak of a signal waveform obtained at the edge 1303 can be detected to be relatively higher, as compared with the other parts. Therefore, for example, it is considered that a secondary electron deflection condition when a peak height in the attention region 1502 becomes a predetermined value or more is set as an appropriate deflection condition.

It is also considered that a deflection condition in which the peak height in the attention region 1502 becomes the largest is selected from a plurality of secondary electron deflection conditions. Furthermore, because a phenomenon in which peak waveforms of two edges become one obstructs high-precision measurement as described with reference to FIG. 6, a secondary electron deflection condition in which a brightness difference between the edge 1303 (attention region 1502) and the edge 1304 (attention region 1503) becomes the largest or becomes a predetermined value or more may be selected. Note that it is considered that reduction in a detection amount in the upper detector means that a detection amount in the lower detector is relatively improved, and therefore, in a case where the deflection condition in which the brightness difference between the attention region 1502 and the attention region 1503 becomes the largest is selected, it is possible to select an appropriate deflection condition also for the lower detector as a result.

An appropriate deflection condition may be obtained by detecting a signal waveform in the attention region 1502 in the upper detector and detecting a signal waveform in the attention region 1503 in the lower detector. In this case, a deflection condition in which a peak height in each of the attention regions becomes a predetermined value or more or a deflection condition in which an added value of the two peak heights becomes the largest may be selected. In Step 1604, an appropriate secondary electron deflection condition is selected based on the above methods.

The secondary electron deflection condition selected as described above is stored as a device condition in, for example, a memory in the arithmetic processing device illustrated in FIG. 4.

According to the method of setting the deflection condition described above, it is easy to find an appropriate deflection condition for two or more edges which are reference of measurement. Further, it is possible to accurately capture the two or more edge positions which are the reference of the measurement in a single secondary electron deflection condition.

EXAMPLE 2

An example where one edge and the other edge of a pattern are detected by setting a single secondary electron deflection condition with the use of the two detectors, i.e., the upper detector and the lower detector has been mainly described in Example 1. However, in this example, an example where a size between edges is measured by setting two or more secondary electron deflection conditions will be mainly described. FIG. 13 illustrates an example thereof, and scanning regions 1301 (alternate long and short dash line) and 1302 (long dashed double-short dashed line) by electron beams are set at the edge 1303 and the edge 1304, respectively, which are measurement reference. Note that, in this example, the scanning region 1301 and the scanning region 1302 are scanned at different timings. In a case where the scanning region 1301 is scanned, a secondary electron deflection condition in which electrons emitted from the edge 1303 are detected appropriately (so that a detection amount of electrons in the edge position is more than a detection amount of electrons previously detected therein) is set. In a case where the scanning region 1302 is scanned, a secondary electron deflection condition in which electrons emitted from the edge 1304 are appropriately detected is set.

By scanning the scanning region 1301, a peak waveform 1305 can be obtained. Further, by scanning the scanning region 1302, a peak waveform 1306 can be obtained. Although the two peak waveforms 1305 and 1306 are obtained at different timings, the scanning regions 1301 and 1302 have a known positional relationship, and therefore it is possible to measure the size between the edges with the use of the two peak waveforms. In a case of FIG. 13, an overlapping region is set between the two scanning regions, and a width thereof is Δd. A distance between an end of the scanning region and a peak of the peak waveform 1305 is LW1, and a distance between an end of the scanning region and a peak of the peak waveform 1306 is LW2. Therefore, it is possible to obtain the size between the edges by calculating LW1+LW2−Δd with the use of the pattern measurement unit or the like of FIG. 4.

FIG. 14 illustrates an example of scanning signals at the time of scanning the scanning regions illustrated in FIG. 13. In a frame 1, signals for scanning the scanning region 1301 is supplied to a main body of the scanning electron microscope from the control device while the secondary electron deflection condition is set to a first state. Next, in a frame 2, the scanning region 1302 is scanned while the secondary electron deflection condition is set to a second state. By adding and averaging signals obtained by repeating such processing in each of the scanning regions, signal waveforms thereof are formed.

Note that, in this example, only one detector is needed. For example, in a case where signals are detected in the upper detector of FIG. 1, only the secondary electron limit plate 31 (opening forming member having an opening for allowing a part of electrons to selectively pass therethrough) needs to be provided and the lower detector is not needed. On the contrary, edge detection may be performed with the use of the lower detector in a deflection condition in which, when a peak waveform of one edge is obtained, signals for forming a peak waveform of the other edge are caused to pass through the opening of the secondary electron limit plate 31.

FIG. 17 illustrates a still another example where beam scanning is performed while secondary electron deflection conditions suitable for a plurality of edges is selected. FIG. 17 illustrates an example of performing bidirectional scanning in which scanning lines 1701 (solid lines) and scanning lines 1702 (dotted lines) are in opposite directions. In the example of FIG. 17, a secondary electron deflection condition (deflection condition 1) suitable for detection of electrons emitted from a left edge is selected in a case where scanning of the scanning lines 1701 is performed, and a secondary electron deflection condition (deflection condition 2) suitable for detection of electrons emitted from a right edge is selected in a case where scanning of the scanning lines 1702 is performed. According to such scanning and selection of the secondary electron deflection conditions, it is possible to unify a relationship between the scanning directions and positions of the edges at the left and right edges, and therefore two peaks can be formed in the same condition. As a result, it is possible to perform high-precision length measurement.

EXAMPLE 3

Example 2 will be described below. In SADP (Self-Alighned Double Patterning) process management, management of a CD value of a space is important. FIG. 10 illustrates a pattern formed by the SADP. Herein, a space between two spacer patterns formed by the same core pattern is referred to as a core space, and adjacent spacers formed by different core patterns are referred to as a gap space. Two kinds of space CDs of the core and the gap are individually changed depending on the CD of the core pattern, a film thickness of a spacer material, and an etching property. Herein, although the core and the gap are easily determined based on a cross-sectional image, it is difficult to determine the core and the gap on the basis of a Top View of the CD-SEM. Because a shape of a line forming the core is different from that of a line forming the gap, it is possible to emphasize a shape difference by performing discrimination based on an azimuth angle.

Azimuth angle discrimination is performed on a line having a cross-sectional shape of FIG. 11 (a). Herein, in order to emphasize a shape difference in the line in the X direction, secondary electrons are deflected in the X direction. In this case, adjustment of a reach position of secondary electrons performed in Example 1 is performed. Distribution of emitted secondary electrons is changed depending on a shape of the line. FIG. 11(b) illustrates signal waveforms. A signal difference separated based on an azimuth angle becomes larger as an edge is closer to a right angle. Meanwhile, in a case of a rounded edge, an effect of azimuth angle discrimination is reduced, and therefore the signal difference becomes small. As described above, by comparing the signal difference between edges in both ends, a shape difference (which edge has a more rounded shape) can be determined, and the core and the gap can be also determined.

FIG. 12 is a flow showing determination of a shape difference. An original shape can be determined by evaluating a signal difference by azimuth angle discrimination in a part (i.e., edge) where a shape difference is to be determined. Further, in a case where there is a database in which cross-sectional images and signal waveforms are associated with each other on the basis of an electron beam simulation based on a Monte Carlo method or a result of an experiment, it is possible to three-dimensionally evaluate an original shape by combining the database with an azimuth angle discrimination image.

REFERENCE SIGNS LIST

1 . . . primary electron beam, 2(a) . . . secondary electron (high-angle component), 2(b) . . . secondary electron (low-angle component), 11 . . . field emission cathode, 12 . . . extraction electrode, 13 . . . extraction voltage, 14 . . . condenser lens, 15 . . . stop, 17 . . . objective lens, 18 . . . acceleration tube, 20 . . . guide, 21 . . . upper scanning deflector, 22 . . . lower scanning deflector, 23 . . . sample, 24 . . . holder, 25 . . . upper image shift deflector, 26 . . . lower image shift deflector, 27 . . . reflection plate, 28(a) . . . upper detector, 28 (b) . . . lower detector, 31 . . . secondary electron limit plate, 32 . . . secondary electron aligner I, 33(a) . . . secondary electron aligner II(U), 33 (b) . . . secondary electron aligner II(L), 34 . . . energy filter, 40 . . . computer, 41 . . . control device, 42 . . . objective lens control power supply, 43 . . . retarding voltage power supply, 44 . . . acceleration voltage power supply, 45 . . . recording device

The invention claimed is:
1. A charged particle beam apparatus comprising:
a first detector including:
a first opening portion forming member having a first passage opening through which a charged particle beam emitted from a charged particle source passes and a detection part that detects charged particles generated by collision of the charged particles emitted from the sample to the first opening portion forming member, or
a detection part having the first passage opening through which the charged particle beam emitted from the charged particle source passes and detecting the charged particles emitted from the sample;
a second detector including:
a second opening portion forming member having a second passage opening through which the charged particle beam emitted from the charged particle source passes and a detection part that detects charged particles generated by collision of the charged particles passing through the first passage opening to the second opening portion member, or
a detection part having the second passage opening through which the charged particle beam emitted from the charged particle source passes and detecting the charged particles which pass through the first opening;
a deflector that deflects the charged particles emitted from the sample by irradiating the sample with the charged particle beam; and
a control device configured to
control the deflector to detect a first detected signal in which a signal of one edge is emphasized relatively more than a signal of another edge among a plurality of edges on the sample based on an output of the first detector, and detect a second detected signal in which the signal of the another edge is emphasized relatively more than the signal of the one edge among the plurality of edges based on an output of the second detector,
generate a first signal waveform from the first detected signal and a second signal waveform from the second detected signal, and
perform pattern measurement using the first signal waveform and the second signal waveform.

2. The charged particle beam apparatus according to claim 1, wherein
the control device is configured to control the deflector so that a detected signal amount of the one edge by the detector is increased.

3. The charged particle beam apparatus according to claim 1, wherein
the control device is configured to control the deflector so that the charged particles emitted from the sample are deflected in a direction orthogonal to an extension direction of a pattern formed on the sample.

4. The charged particle beam apparatus according to claim 3, wherein
the control device is configured to read the extension direction of the pattern from design data and reflects the extension direction in a deflection condition of secondary electrons.

5. The charged particle beam apparatus according to claim 3, wherein
a direction of a track of secondary electrons to be deflected is a linear direction connecting two points to determine a shape difference in an observation pattern.

6. The charged particle beam apparatus according to claim 1, wherein
the control device is configured to synthesize two or more SEM images in which different azimuth angle components are detected and perform length measurement of a size of a pattern on the basis of edges of patterns extracted from the respective images.

7. The charged particle beam apparatus according to claim 1, wherein
the control device is configured to synthesize two or more SEM images in which different azimuth angle components are detected and predict an original shape.

8. The charged particle beam apparatus according to claim 1, wherein
the controller is configured to determine a distance of a track of secondary electrons to be deflected based on a range of secondary electrons reaching the opening portion forming member.

9. The charged particle beam apparatus according to claim 1, wherein
before secondary electrons are deflected and detected, the control device is configured to determine a reach position of the secondary electrons and cause the reach position to correspond to the center of a field of view at the time of observation by scanning a surface with an electron beam.

10. The charged particle beam apparatus according to claim 1, wherein
the control device is configured to determine a direction and a distance of secondary electrons to be deflected based on a reach position of the secondary electrons toward a stop and a spread range of the secondary electrons in the stop.

11. A charged particle beam apparatus including comprising:
a detector including:
a first opening portion forming member having a first passage opening through which a charged particle beam emitted from a charged particle source passes and a detection part that detects charged particles generated by collision of the charged particles emitted from the sample to the first opening portion forming member, or
a detection part having the first passage opening through which the charged particle beam emitted from the charged particle source passes and detecting the charged particles emitted from the sample;
a deflector that deflects the charged particles emitted from the sample by irradiating the sample with the charged particle beam; and
a control device that controls the deflector, the control device being configured to switch a deflection condition of the deflector between a first deflection condition and a second deflection condition to
obtain a first detected signal by controlling the deflector under the first deflection condition in which the charged particle beam is deflected such that the charged particles emitted from one edge among a plurality of edges on the sample are directed to the first opening portion forming member or the detection part while the charged particles emitted from another edge among the plurality of edges are directed to the passage opening,
obtain a second detected signal by controlling the deflector under the second deflection condition in which the charged particle beam is deflected such that the charged particles emitted from the another edge are directed to the first opening portion forming member or the detection part while the charged particles emitted from the one edge are directed to the passage opening, and
perform pattern measurement using the first detected signal and the second detected signal.

12. A charged particle beam apparatus comprising:
a detector including:
- a first opening portion forming member having a first passage opening through which a charged particle beam emitted from a charged particle source passes and a detection part detecting charged particles generated by collision of charged particles emitted from the sample to the first opening portion forming member, or
- a detection part having the first passage opening through which the charged particle beam emitted from the charged particle source passes and detecting the charged particles emitted from the sample;

a second opening portion forming member that is different from the detector and is arranged between the detector and the sample;

a deflector that deflects the charged particles emitted from the sample by irradiating the sample with the charged particle beam; and a control device configured to switch a deflection condition of the deflector between a first deflection condition and a second deflection condition to:
- control the deflector to detect a first detected signal under the first deflection condition in which the charged particle beam is deflected such that the charged particles emitted from one edge among a plurality of edges on the sample are directed to the first opening portion forming member or the detection part while the charged particles emitted from another edge among the plurality of edges are directed to the second opening portion forming member, and detect a second detected signal under the second deflection condition in which the charged particle beam is deflected such that the charged particles emitted from the another edge are directed to the first opening portion forming member or the detection part while the charged particles emitted from the one edge are directed to the second opening portion forming member,
- generate a first signal waveform from the first detected signal and a second signal waveform from the second detected signal, and
- perform pattern measurement using the first signal waveform and the second signal waveform.

* * * * *